(12) United States Patent
Duineveld et al.

(10) Patent No.: US 7,011,561 B2
(45) Date of Patent: Mar. 14, 2006

(54) METHOD OF MANUFACTURING AN ELECTROLUMINESCENT DEVICE

(75) Inventors: Paulus Cornelis Duineveld, Eindhoven (NL); Ivo Godfried Jozef Camps, Eindhvoen (NL); Coen Theodorus Hubertus Fransiscus Liedenbaum, Eindhoven (NL); Eliav Itzhak Haskal, Eindhoven (NL); Maria Henrica Wilhelmina Antonia Van Deurzen, Eindhoven (NL); Jochem Petrus Maria De Koning, Breda (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/928,948

(22) Filed: Aug. 27, 2004

(65) Prior Publication Data

US 2005/0122040 A1  Jun. 9, 2005

Related U.S. Application Data

(62) Division of application No. 10/131,780, filed on Apr. 24, 2002, now Pat. No. 6,891,327.

(30) Foreign Application Priority Data

Apr. 26, 2001 (EP) .................................. 01201525

(51) Int. Cl.
*H05B 33/00* (2006.01)

(52) U.S. Cl. .......................................... 445/23; 445/25
(58) Field of Classification Search ............. 445/23–25
See application file for complete search history.

(56) References Cited

U.S. PATENT DOCUMENTS 5,701,055 A * 12/1997 Nagayama et al. ......... 313/504

FOREIGN PATENT DOCUMENTS

| EP | 0938248 | 8/1999 |
| EP | 0938248 A | 8/1999 |
| GB | 2347017 A | 8/2000 |
| WO | WO0139272 | 5/2001 |

* cited by examiner

*Primary Examiner*—Joseph Williams

(57) ABSTRACT

A method of manufacturing an electroluminescent device comprising forming a pattern, depositing a liquid, and processing the liquid to form an electroluminescent region. The pattern includes an overhanging structure with a negatively-sloped section thereunder and a functional region bounded on at least one side by a positively-sloped section. The overhanging structure is on a side of the positively-sloped section that is opposite the functional region. The liquid is suitable for forming a functional layer within the functional region such that the liquid contacts the a positively-sloped surface of the positively-sloped sections. The positively-sloped sections have a shape and size such that at least some of the liquid is prevented from reaching the negatively-sloped section and being taken up by a capillary channel of the negatively-sloped section.

15 Claims, 6 Drawing Sheets

METHOD OF MANUFACTURING AN ELECTROLUMINESCENT DEVICE

Figure 1:
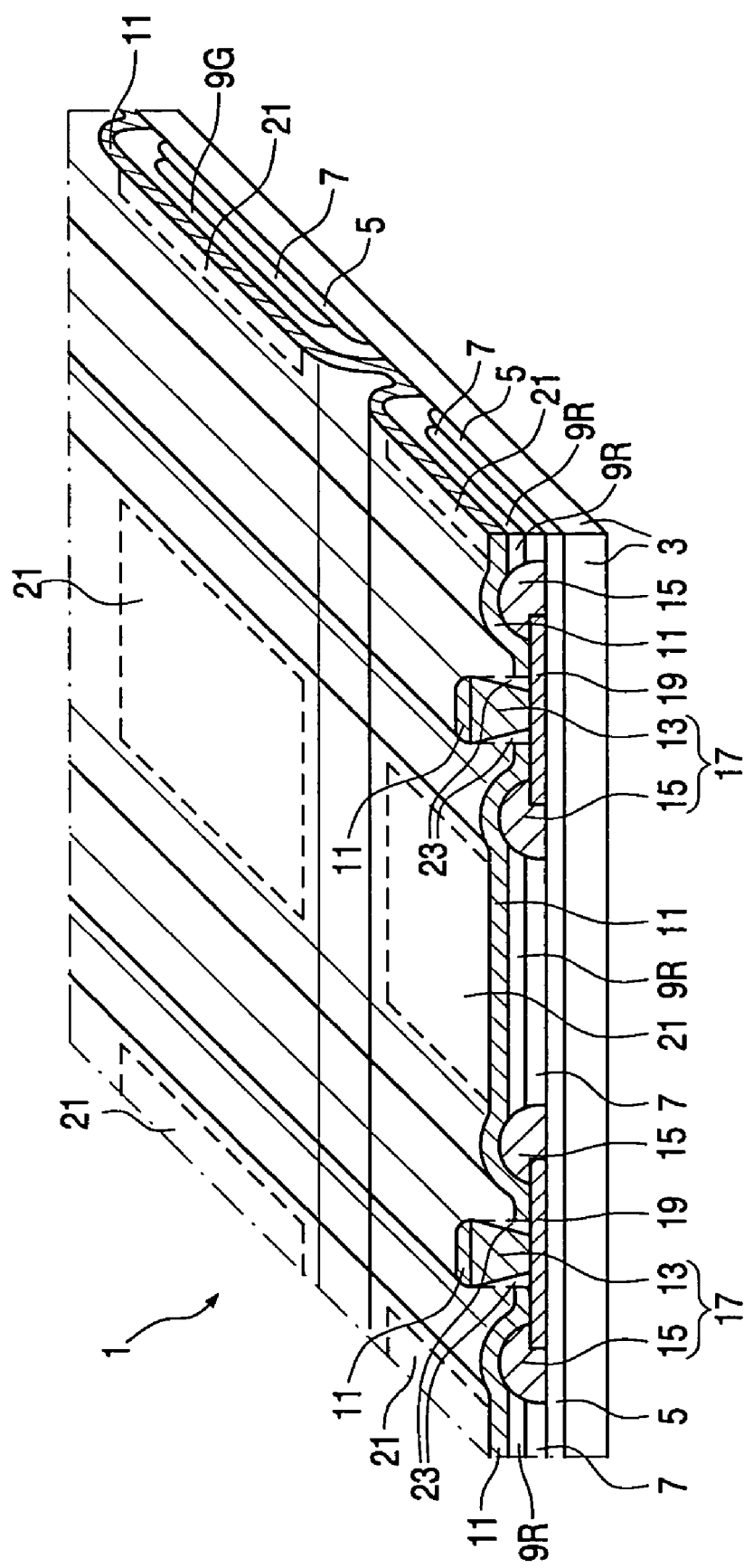

This is a Division of application Ser. No. 10/131,780, filed Apr. 24, 2002, now U.S. Pat. No. 6,891,327.

The invention relates to an electroluminescent device and a method of manufacturing thereof.

Generally, an electroluminescent (EL) device is a device comprising EL material capable of emitting light when a current is passed through it, the current being supplied by means of electrodes. If the EL material or any other functional material, if present, disposed between the electrodes or electrode layers is of organic or polymeric nature the device is referred to as an organic or polymer(ic) EL device respectively. In the context of the invention, the term organic includes polymeric.

EL devices of the diode type, light-emitting diodes, preferentially pass current in one direction and generally comprise EL material disposed between a hole-injecting electrode (also referred to as the anode), an electron-injecting electrode (also referred to as the cathode). Upon application of a suitable voltage, holes and electrons are injected into the EL material by the anode and cathode respectively. Light is produced by radiative recombination of holes and electrons inside the EL material. Using different organic EL materials, the color of the light emitted can be varied.

EL devices can be used as light sources and, in particular those of the organic type, are suitable for large area lighting applications such as a back light for a display. (Organic) EL devices comprising a plurality of electroluminescent elements (hereinafter also referred to as pixels) are suitable for display purposes such as a monochrome or multi-color display device, a still image display, a segmented display device, or a matrix display of the passive or active type. Organic and in particular polymer EL devices can be made flexible or shaped allowing display applications not realizable with rigid and/or flat displays.

In U.S. Pat. No. 5,701,055 an electroluminescent display device having a plurality of emitting portions is disclosed. The panel comprises a first electrode layer onto which organic functional layers are formed onto which a second electrode layer is formed. The panel further comprises electrical insulating ramparts projecting from the substrate. The ramparts have overhanging sections projecting in a direction parallel to the substrate. By providing shadow regions for the flux of metal vapor used to deposit the second electrode layer, the ramparts serve to provide a patterned second electrode layer.

A drawback of the known EL display panel is that the deposition of the organic functional layers is performed using vacuum deposition methods. Vacuum-based deposition methods require expensive equipment, are relatively time-consuming and are not particularly suited for mass-fabrication of large surface devices such as displays. With respect to these aspects, the use of wet deposition methods such as spin-coating and ink-jet printing in terms would simplify processing, increase throughput and improve process economy.

It is an object of the invention, inter alia, to provide an electroluminescent device which is adapted for reliable manufacture thereof using a simple and economic method suitable for mass-fabrication of large surface devices which comprises the steps of providing a functional or functional layers using a wet deposition method and providing a patterned electrode layer by means of the known overhanging sections.

More in particular, the object is to provide an EL device, adapted to be capable of being manufactured using a method wherein the use of wet deposition methods does not adversely effect, at least not significantly, the yield of the electrode layer patterning process by means of the over-hanging sections. In the case of a multi-color EL device, color separation has to be satisfactory. Moreover, in the case of EL devices having independently addressable pixels, leakage current and cross-talk between such pixels is to be small, even and in particular if the multi-pixel device comprises a wet-deposited charge transport layer.

These and other objects are achieved by an electroluminescent device comprising:
a first and a second electrode layer,
one or more functional layers being disposed between the first and the second electrode layer to form at least one electroluminescent area, and
a relief pattern comprising at least an overhanging section and, erected at distance of said overhanging section, an accompanying positively-sloped section disposed between said overhanging section and said electroluminescent area and extending along a side or sides thereof.

The invention is based on the insight that the overhanging section of the relief pattern and the surface supporting that overhanging section together form a capillary channel which is very effective in taking up and transporting fluid. More in particular, the channel is capable of taking up and transporting fluid used in the wet deposition of a functional such as the electroluminescent layer.

The taking up of fluid from which functional material is obtainable, leads to deposition of functional material in the channel thus reducing the size of the of the shadowing region created by the overhanging section necessary to pattern the electrode layer and thus the efficacy thereof. Consequently, short-circuits among electrodes of the patterned electrode layer formation are more likely to occur and accordingly the yield of EL device manufacturing process is reduced. In the case of fluid from which charge transport material is obtainable, the take up of fluid can establish an electrical connection among the electrodes of the first electrode layer which are supposed to be independently addressable thus leading to significant a leakage current and/or cross-talk.

The transport of fluid along the capillary channels may lead to deposition of functional material in places where it is undesirable. For example, in the case of a multi-color EL device, the transport of fluid from which electroluminescent material capable of emitting light of a first color from an area arranged to emit light of said first color to an area arranged to emit light of a second color will lead to undesirable color mixing, a process also referred to as color bleeding. Another possibility is that re-deposition of transported fluid causes light emission in areas which are supposed to emit light.

In any case, the take-up or at least the transport or at least the re-deposition of fluid by a capillary channel is to be avoided.

In order to prevent or at least hinder the taking up and transport of fluid along the capillary channel and/or, if any fluid is taken up and/or transported by the channel, the re-deposition of that fluid into unwanted areas, the relief pattern comprises a positively-sloped section set up at distance from and accompanying the overhanging section. The accompanying positively-sloped section extends along a side or sides of a light emitting area and between the overhanging section it accompanies.

The accompanying positively-sloped section has the capability of stopping fluid. Obviously, in order not to form itself a capillary with a substrate supporting it, the section is positive-sloped, at least on the side on which it is to stop fluid. Generally, as the fluid which can reach the overhanging section is primarily fluid which is used in the deposition of the functional layers part of the light emitting area, the side of the accompanying positively-sloped section facing the light emitting area and facing away from the overhanging section is positively-sloped.

In the event, despite the presence of an accompanying positively-sloped section, any fluid is able to reach the capillary channel and is transported to another location, an accompanying positively-sloped section erected at that location may serve to prevent or hinder the release or re-introduction of the transported fluid into undesired areas. For this purpose the side of the accompanying positively-sloped section facing the capillary may be positive-sloped but this is not essential. For ease of manufacture having both sides positively-sloped is preferred.

By using the accompanying positively-sloped section two formerly incompatible, yet in their own right attractive methods can be used in conjunction thus arriving at an EL device which can be manufactured in a particularly simple and cost-effective manner. The first of the said two methods is the pattern-wise deposition of the second electrode layer using the overhanging sections of the relief pattern. The second method is the deposition of the functional layer or layers using a wet deposition method such as ink-jet printing.

A positively-sloped section is understood to mean a section which does not have a shadow region and may include a section having perpendicular side-walls. An overhanging section is understood to mean a section which creates a shadow region which may under circumstances include a section having perpendicular side-walls. However, in view of the difference is purpose of the overhanging and accompanying positively-sloped section, if one of said section has perpendicular side-walls the other has not.

The accompanying positively-sloped section is erected at some distance of the overhanging section in order to avoid that fluid can contact the overhanging section which may occur during transport of the substrate in manufacture. In order to minimize loss of effective light-emissive area, the distance is to be kept minimal. The distance should be not so small that the base of the accompanying section extends into the shadow region of the overhanging section. The minimal distance is basically determined by the patterning method used to provide the sections of the relief pattern. Suitable distances would be 0.1 $\mu$m to 50 $\mu$m, or 0.5 $\mu$m to 20 $\mu$m, or 1.0 to 10 $\mu$m. The specific shape, width and height of the positively-sloped section is adapted such that the fluid stopped by it will convert into a functional layer which is uniform in thickness across the electroluminescent area along of a side of which the section extends. For details regarding the height, shape and width of a section in order to arrive at functional layers uniform in thickness, reference is made to the non-prepublished international application having application number EP00/1706.

In EP 0 938 248 A2 an EL device comprising a relief pattern comprising an overhanging section and a section accompanying the overhanging section is disclosed. However, the section accompanying section the overhanging section is itself an overhanging section and not positively-sloped. Both sections serve the same purpose, viz. patterning of an electrode layer which purpose is entirely different from the purpose of the positively-sloped section of the present invention. The use of wet deposition to deposit functional layers is not suggested.

The EL device comprises one or more functional layers. Examples ot such functional layers are an electroluminescent, charge transport and charge injecting layers. In order to fully exploit the benefits of the invention, the one or more functional layers are preferably provided using a wet deposition method.

The one or, if there is more than one, at least one of the functional layers is an electroluminescent layer. The EL layer is made of a substantially, preferably organic, electroluminescent material. In the context of the invention, the type of EL material used is not critical and any EL material known in the art can be used. Preferably, however obtainable from a fluid which can be deposited using a wet deposition method. Suitable organic EL materials include organic photo- or electroluminescent, fluorescent and phosphorescent compounds of low or high molecular weight. Suitable low molecular weight compounds are well known in the art and include tris-8-aluminium quinolinol complex and coumarins. Such compounds can be applied using vacuum-deposition method. Alternatively, the low molecular weight compounds can be embedded in a polymer matrix or chemically bonded to polymers, for example by inclusion in the main chain or as side-chains, an example being polyvinylcarbazole.

Preferred high molecular weight materials contain EL polymers having a substantially conjugated backbone (main chain), such as polythiophenes, polyphenylenes, polythiophenevinylenes, or, more preferably, poly-p-phenylenevinylenes. Particularly preferred are (blue-emitting) poly (alkyl)fluorenes and poly-p-phenylenevinylenes which emit red, yellow or green light and are 2-, or 2,5-substituted poly-p-phenylenevinylenes, in particular those having solubility-improving side groups at the 2- and/or 2,5 position such as $C_1$–$C_{20}$, preferably $C_4$–$C_{10}$, alkyl or alkoxy groups. Preferred side groups are methyl, methoxy, 3,7-dimethyloctyloxy, and 2-methylpropoxy. More particularly preferred are polymers including a 2-aryl-1,4-phenylenevinylene repeating unit, the aryl group being optionally substituted with alkyl and/or alkoxy groups of the type above, in particular methyl, methoxy, 3,7-dimethyloctyloxy, or, better still, 2-methylpropoxy. The organic material may contain one or more of such compounds. Such EL polymers can suitably be applied by wet deposition techniques.

In the context of the invention, the term organic includes polymeric whereas the term polymer and affixes derived therefrom, includes homopolymer, copolymer, terpolymer and higher homologues as well as oligomer.

Optionally, the organic EL material contains further substances, organic or inorganic in nature, which may be homogeneously distributed on a molecular scale or present in the form of a particle distribution. In particular, compounds improving the charge-injecting and/or charge-transport capability of electrons and/or holes, compounds to improve and/or modify the intensity or color of the light emitted, stabilizers, and the like may be present.

The organic EL layer preferably has an average thickness of 50 nm to 200 nm, in particular, 60 nm to 150 nm or, preferably, 70 nm to 100 nm.

Optionally, the EL device comprises further, preferably organic, functional layers disposed between the electrodes. Such further layers may be hole-injecting and/or transport (HTL) layers and electron-injecting and transport (ETL) layers. Examples of EL devices comprising more than one functional layer are a laminate of anode/HTL layer/EL layer/cathode, anode/EL layer/ETL layer/cathode, or anode/HTL layer/EL layer/ETL layer/cathode.

Suitable materials for the hole-injecting and/or hole-transport layers (HTL) include aromatic tertiary amines, in particular diamines or higher homologues, polyvinylcarbazole, quinacridone, porphyrins, phthalocyanines, polyaniline and poly-3,4-ethylenedioxythiophene.

Suitable materials for the electron-injecting and/or electron-transport layers (ETL) are oxadiazole-based compounds and aluminiumquinoline compounds.

If ITO is used as the anode, the EL device preferably comprises a 50 to 300 nm thick layer of the hole-injecting/transport layer material poly-3,4-ethylenedioxythiophene or a 50 to 200 nm thick layer of polyaniline.

Generally, the EL device comprises a substrate. Preferably, the substrate is transparent with respect to the light to be emitted. Suitable substrate materials include transparent synthetic resin which may or may not be flexible, quartz, ceramics and glass. The substrate provides the supporting surface for the relief pattern.

Although in its broadest sense, the invention is applicable to EL devices having a single electroluminescent area, the invention is particularly beneficial for an electroluminescent device comprising a plurality of light emitting areas. The accompanying sections have the function of preventing functional layer material from being deposited in the wrong light emitting areas and/or in areas where no light emission is to occur.

For display purposes, the separate light emitting areas are referred to as EL elements or pixels and are generally independently addressable. Each EL element has an area capable of light emission. The light emissive area is part of the EL layer. A light emissive area is formed by the area of overlap of a first electrode, a second electrode, and an organic EL layer. The EL device may be a segmented or matrix display device of the passive or active type.

The first electrode layer may be electron-injecting and the second electrode layer hole-injecting. Alternatively, the first electrode layer is hole injecting and the second electrode layer is electron injecting.

An electron-injecting electrode is suitably made of a metal (alloy) having a low work function, such as Yb, Ca, Mg:Ag Li:Al, Ba or is a laminate of different layers such as Ba/Al or Ba/Ag electrode.

A hole-injecting electrode is suitably made of a metal (alloy) having a high work function such as Au, Pt, Ag. Preferably, a more transparent hole-injecting electrode material, such as an indiumtinoxide (ITO), is used. Conductive polymers such as a polyaniline (PANI) and a poly-3,4-ethylenedioxythiophene (PEDOT) are also suitable transparent hole-injecting electrode materials. Preferably, a PANI layer has a thickness of 50 to 200 nm, and a PEDOT layer 100 to 300 nm. If an ITO hole-injecting electrode is used, the first electrode is preferably the hole-injecting electrode.

The overhanging section has a function of patterning the second electrode layer, by providing a shadow region in which electrode material is not deposited when depositing the second electrode layer by means of vapor vacuum deposition. Preferably, the electron-injecting electrode is deposited using the overhanging section and the low work function materials indicated above can be deposited in this manner.

A particular embodiment of the EL device in accordance with the invention is one wherein
an insulating layer is provided between the negatively-sloped and the accompanying positively-sloped section which insulating layer electrically insulates the first electrode layer from the second electrode layer.

Having erected an accompanying positively-sloped section at distance from the negatively-sloped section renders the space between the negatively-sloped and the accompanying positively-sloped section generally void of any functional layer material which may leave the first electrode layer exposed. If this is the case, second electrode layer material which, when deposited by means of vacuum deposition, is deposited in all areas not covered by or lying in the shadow region of the overhanging section, is deposited directly on top of the first electrode layer leading to a short circuit when a voltage is applied across the first and second electrode layer. By providing an electrically insulating layer between the negatively-sloped and accompanying positively-sloped section short-circuits are prevented. Generally, the layer is to be provided only between the negatively-sloped and the accompanying positively-sloped section and will accordingly be a patterned layer. In order to retain the effect of the accompanying positively-sloped section, the thickness of the insulating layer should not less than the height of the accompanying positively-sloped section. This condition is conveniently met, for example, by positioning the accompanying positively-sloped section on top of the insulating layer.

The choice of insulating layer and method of providing such is not critical. Any conventional insulating material and method of providing such may be used. The layer may be of inorganic such as a ceramic material or a glass or other oxidic material, such as silicondioxide, a sol gel layer or of organic origin such as a polymeric material, such as a polyimide. Preferably, the insulating layer is made of conventional photoresist.

Conveniently, but not necessarily, the electrically insulating layer is made of the same material and/or part of the relief pattern. If the insulating layer is made or relief pattern material, such as photoresist, and its thickness is to be less than the height of the accompanying positively-sloped section an extra photolithographic step would normally be required for the deposition of the insulating layer.

Alternatively, an accompanying section and an insulating layer supporting that section can be integrated to form an integral section of the relief pattern. Such integral section can be advantageously formed in a single photolithographic step using, for example, an appropriate gray level mask or a double exposure using two different masks.

A further particular embodiment of the electroluminescent device in accordance with the invention is characterized in that the relief pattern comprises at least one partitioning section extending along a side or sides of the electroluminescent area distinct from the side or sides along which accompanying positively-sloped section extends.

By using partitioning relief pattern sections further control over of the deposition of fluid from which the one or more functional layer is or are to be obtained is achieved.

Preferably, all sides of an electroluminescent area, possibly excepting the sides of an electroluminescent area which form a part of the perimeter of the display area of the EL device, are provided with sections of the relief pattern in order to prevent fluid from which a functional layer is to be obtained from spreading into unwanted areas and in order to obtain a homogeneous layer thickness inside the electroluminescent area by appropriately selecting the profile and height of the said sections with respect to the fluid to be deposited. The accompanying positively-sloped section and/or the additional section serve to define an enclosure, a well, in which the fluid is to be deposited in a form compatible with the electroluminescent area. Depending on the type of EL device and method of depositing the fluid, the sections may form the rim of a closed cylindrical well which of course, where the term cylindrical includes, as usual, rectangular, hexagonal and the like or the well may be open ended on one or more sides to form a channel or a gutter.

In a preferred embodiment the partitioning sections do not extend beyond the accompanying section or section in any direction towards the overhanging section.

If the wettability of the fluid from which a functional layer is obtainable is poor with respect to the relief pattern material, an example of such a combination being water-based PEDOT and conventional photoresist, the shape or the layout of the accompanying and/or partitioning sections is not very critical in order to prevent fluid from spilling over into the space between the accompanying section and the negatively-sloped section.

However, if the wettability of the fluid with respect to the sections of the relief pattern is good which is, for example, the case if the relief pattern is made of conventional resist and the functional layer is deposited using a fluid which comprises an organic solvent, an example of such a fluid being poly-phenylenevinylene polymer dissolved in xylene or anisole, the layout is more critical. Especially in the corners of the well formed by the accompanying and partitioning sections, that is where the partitioning and accompanying sections meet there is a risk of fluid spilling over which spilled fluid can then be taken up by the overhanging section. By arranging the partitioning section or sections not to extend beyond the accompanying section the risk is spilling over is further reduced.

In another preferred embodiment of the EL device in accordance with the invention, any bends formed where an partitioning section and accompanying section meet (also referred to as a corner of the well) or any bend formed within any such section are rounded. Using rounded bends it is more difficult for fluid to creep up a relief pattern section.

Alternatively or additionally, the risk of spilling over may be reduced by subjecting the relief pattern surface to an anti-wetting treatment to increase the contact angle between fluid and the surface. Anti-wetting treatments and agents for use in such treatments are well known in the art and include plasma treatments, corona discharge, surfactants and the like. In the case of a photoresist relief pattern the anti-wetting treatment may comprise exposing the photoresist surface to fluorinated hydrocarbons. Alternatively or in addition the fluid may be modified to reduce the wettability by adding surfactants and the like. Such methods are well known in the art.

A preferred embodiment of the EL device is one wherein the partitioning section is subdivided, along a direction or directions substantially parallel to the side or sides of the electroluminescent area along which the partitioning section extends, into one or more mutually separate subsections.

If, and in multi-pixel devices this is generally the case, a partitioning section has the function of stopping or pinning fluid on both its sides, there is a risk that fluid layers deposited on either side thereof inadvertently merge to form a single fluid layer. This is in particular the case if the fluid wets the partitioning section well. Since the thickness and uniformity in thickness of the functional layer obtained from the fluid layer critically depends on how the fluid is arranged on the partitioning section, inadvertent merging of fluid the thickness and thickness uniformity of the relevant functional layers will be adversely affected. Moreover, in the case of a multi-color device inadvertent merging will lead to color mixing. One way to reduce the risk of merging is not to print in on both sides of a partitioning section at the same time but this increases the number of fluid to functional layer conversion steps. Moreover, there is still a risk of spilling over of fluid in an adjacent pixel area thus leading non-uniform layer thickness and color mixing in said adjacent pixel area. By subdividing the partitioning section in accordance with said preferred embodiment, the risk of inadvertent merging is significantly reduced allowing simultaneous printing in adjacent wells. Moreover any spilled over liquid will end up in the inactive areas between the subsections. A corollary of the reduced risk of merging is that a given partitioning section can accommodate more fluid. Since the amount of fluid deposited is an important parameter for obtaining a functional uniform in thickness the range of fluids which can be printed is broadened.

The subdivision is an invention in itself, independent of the use of an accompanying section in front of an overhanging section. For further details regarding said subdivided partitioning sections reference is made to an EP patent application filed concurrently by Applicant, applicant's reference NL010237, entitled "Electroluminescent device and method of manufacturing thereof".

A preferred embodiment of the electroluminescent device is one wherein the first electrode layer comprises one or more bus electrodes and one or more pixel electrodes, the bus electrode or electrodes being buried by a section or sections of the relief pattern to electrically insulate the bus electrode or electrodes from the second electrode layer.

If bus electrodes buried by sections of the relief pattern are used, no separate insulating layer is necessary to insulate the first and second electrode layer as the section of the relief pattern performs this purpose. A partitioning section may be conveniently used to bury a bus electrode. Since this section may be provided at the same time as the accompanying positively-sloped section the extra steps involved in depositing an insulating layer are avoided. The bus electrode may be made of the same material as the pixel electrodes which has the advantage that the pixels and bus electrode can be provided simultaneously. Alternatively, the bus and pixel electrode can be made of different materials, which allows the selection of each electrode material to be optimized for its particular purpose. For example, the bus electrode can be made of a highly conductive metal such as copper which allows the bus electrodes to be narrow and therefore loss of useful emissive area may be minimized, that is fill factor is improved.

Those skilled in the art will appreciate that any particular embodiment described hereinabove can be combined with any other particular embodiment to obtain further improved EL devices.

In its broadest sense, the invention is applicable to any type of EL device such as a monochrome or multi-color display device, a still image display, a segmented display device, or a matrix display of the passive or active type.

Depending on the particular type of display, the first and/or second electrode layer may comprise one or more common electrodes. A common electrode is one which serves as the second electrode of more than one EL element.

Generally, in a (multi-color) segmented display device, at least the first or second electrode layer comprises common electrodes.

In a matrix display of the active type, EL elements are driven by means of active switching elements such as thin film transistors (TFT's). Generally, an active matrix device comprises a single common second (first) electrode and the (second) first electrodes are independently addressable.

In a particular embodiment, the invention relates to an electroluminescent device, wherein the electroluminescent device is a matrix display device of the passive type comprising row electrodes as the first electrode layer, column electrodes as the second electrode layer, independently addressable electroluminescent areas formed at crossings of row and column electrodes, and wherein the relief pattern comprises overhanging sections in the form of strips extending along and between the column electrodes and accompanying positively-sloped rib sections extending along and set up at distance of the overhanging sections.

In the particular embodiment of the passive matrix device, the overhanging sections are used to pattern the column electrodes of the second electrode layer which are provided in the form of strips. As a consequence, the overhanging section extends across the entire display area and the capillary can take up and transport fluid effectively over large distances and the provision of an accompanying section is of particular benefit in this embodiment.

As the EL device in accordance with the invention requires a voltage of only a few volts to provide a brightness suitable for display purposes and/or consumes a small amount of power the EL device is particularly suitable for displays of battery operated and/or portable, in particular hand-held, electronic equipment such as lap top computers, palm top computers, personal organizers, mobile phones optionally provided with internet access or other services requiring the presentation of (video) images. The EL device allows internet data and image data to be displayed at video rates.

In another aspect, the invention therefore relates to a battery-operated and/or hand-held electronic device, such as a mobile phone, provided with an EL display device in accordance with the invention.

In another aspect the invention relates to a method of manufacturing an EL device. The method comprises the step of depositing the functional layer or of at least one of the functional layers using a wet deposition method.

The presence of the overhanging section enables the method in accordance with the invention to comprise a step of patterning the second electrode layer by means of the overhanging section combined with a step or steps of providing a functional layer or layers using a wet deposition method. As described hereinabove, said combination of method steps is made possible by providing the device with accompanying sections of the type described hereinabove.

In a typical embodiment, the method in accordance with the invention comprises the steps of providing:

- a substrate (optional);
- a first electrode layer;
- a relief pattern comprising at least one overhanging section for patterning the second electrode layer and, erected at distance of said overhanging section, an accompanying positively-sloped section extending along said overhanging section;
- one or more functional layers by means of a wet deposition method, wherein a fluid from which a functional layer is obtainable is deposited at least in the area in which an electroluminescent area is to be formed and the fluid thus deposited is converted into the functional layer, the fluid being deposited such that at some stage the fluid is stopped by the accompanying section and
- a second electrode layer patterned by means of the overhanging section of the relief pattern.

Examples of suitable first and second electrode layers, functional layers and relief patterns have already been described hereinabove.

Individually, each of the method steps required to manufacture the EL device is conventional and well-known to those skilled in the art. For example, a relief pattern can be conveniently manufactured using photolithography, if needed by performing various photolithographic steps in succession. It will be further clear to those skilled in the art how to manufacture the various embodiments of the EL devices in accordance with the invention described hereinabove.

Use of a wet deposition technique involves depositing a fluid containing functional material or precursor material thereof either selectively or non-selectively, and converting the fluid into functional layer material. In the context of the invention, fluid is understood to mean any deformable mass capable of flowing under pressure and includes suspensions, solutions, dispersions, pastes, inks, lacquers, emulsions, sols and the like.

After the fluid layer is deposited it is converted to the functional layer. The conversion may involve exposing, if required in an inert atmosphere, the fluid layer to increased or reduced temperatures, increased or reduced pressure, and/or radiation. Preferably, the conversion is performed at an elevated temperature.

If the functional layer material is present as such in the fluid layer, it may be sufficient to evaporate a solvent and/or other volatile components. If the fluid layer contains a precursor material of the functional material the conversion also involves a chemical reaction. The wealth of chemical reactions known to those skilled in the art of chemistry may be exploited to derive suitable precursor materials. A preferred precursor material contains leaving groups which are eliminated during the conversion.

The fluid layer may contain further substances. For example, substances which modulate its rheological properties such as viscosity, (visco)elasticity, contact angle and/or wettability. Wetting agents, or anti-wetting agents, leveling agents, surfactants, thickening agents, diluents and the like may be added.

Suitable wet deposition methods include spin-coating, web-coating, doctor blade, spray-coating, roller-coating, curtain-coating, dip-coating, painting or casting. Selective wet deposition techniques include printing methods such as ink-jet printing, screen printing, off-set printing, flexo-printing, lithography and tampon printing.

In a preferred method in accordance with the invention ink-jet printing is used as the wet deposition method.

The term inkjet printing in the present context includes ink-jet printing using a jet consisting of ink drops or a continuous jet (also referred to as dispensing). In order to increase throughput and/or relative alignment accuracy, the use of multi-nozzle ink-jet printing heads is preferred.

In a preferred method of ink-jet printing, ink jet printing is performed at constant frequency and the ink jet printing head is moved relative to the substrate at constant velocity resulting in a series of ink drops deposited equidistantly on the substrate and printing is not interrupted when crossing a section of the relief pattern. The ink drops are spaced such that shortly after deposition the ink drops have merged to form an uninterrupted line of fluid. This preferred method has the advantage that alignment accuracy only needs to be attained in one direction only, viz. the direction at right angles to the direction in which the ink-jet head is moved. In the direction of the ink-jet head the method is self-aligned. Moreover, continuous printing in a line minimizes the number of starts and stops of the ink-jet head and thus increasing through-put time and reliability of the printing process.

An alternative preferred method of ink-jet printing comprises delivering ink drops on demand. Specifically, ink-jet printing is interrupted when crossing a section of the relief pattern. This embodiment has the disadvantage of the needed alignment in two independent directions, but has the advantage that more complex patterns can be printed which particularly useful in multi-color devices such as full-color devices.

In an alternative embodiment of an EL device comprising a relief pattern having an overhanging section for patterning an electrode layer, the problem of capillary action is solved by providing the overhanging section on a pedestal section which is wider than the overhanging section and providing the said pedestal section with a sharp edge capable of pinning the liquid from which a layer of the of the EL device is to be obtained, the sharp edge running parallel to and at distance of the capillary channel formed by the overhanging section and the top surface of the pedestal section which supports the overhanging section. If fluid is deposited adjacent the pedestal section, the fluid spreads and creeps up the pedestal section. After having supplied a certain amount of liquid the fluid will reach the sharp edge. If still more liquid is applied the liquid front will remain pinned on the sharp edge of the pedestal section, that is the liquid front will not proceed beyond the sharp edge to reach the capillary channel. Thus, no transport of fluid will take place along the capillary channel. If the area below the sharp edge is referred to as the side surface of the pedestal section and the area above it as the top surface, the sharp edge is rendered pinning whenever the angle which the liquid surface makes with the top surface is smaller than the static wetting contact angle of the liquid with the surface of the pedestal section. Relevant parameters to render a sharp edge pinning are the wetting properties of the material from which the surface of the pedestal section is made, the liquid height and the pedestal height. Using pedestal sections with sharp edges to prevent capillary fluid transport is a measure which may be applied in conjunction with or independent of any other aspect of the invention.

Another aspect of the invention, more particular an aspect which may be applied independent of other aspects of this invention, relates to a (multi-color) EL device comprising a relief pattern having overhanging section for patterning an electrode layer of the EL device, in particular the cathode layer. The EL device has EL material ink-jet printed between and along the overhanging relief pattern sections. The EL device is rendered multi-color or full-color by having different EL material on either side of an overhanging section. By depositing EL material between and along the overhanging section the overhanging sections serve to contain ink-jetted fluid. Generally, due to the low concentration of EL material in the ink-jetted fluid the layer thickness of the fluid ink-jetted between the overhanging sections is significantly larger than the height of the overhanging section. If the top surface of the overhanging section has good wetting properties with respect to the fluid the fluid will spread over the top surface. According to experiments and calculations this occurs whenever the contact angle of the fluid with respect to the top surface is larger than the advancing contact angle of the fluid with respect to the top surface. Since this spreading occurs by fluid deposited on either side of an overhanging section, color mixing will result and uniform layer formation is impeded. Because of the non-uniform layer formation, the problem is not restricted to EL layers but to the formation of any wet-deposited layer. In order to solve the problems of color mixing and non-uniform layer formation caused by the wetting of the top surface, in accordance with one embodiment of the invention, fluid to be deposited on either side of an overhanging section is not deposited simultaneously but sequentially, the one fluid deposited only after the other fluid has dried. In an alternative embodiment, the top surface of the overhanging section is provided with a relief structure having two elevated regions separated by a recessed region, the first elevated region adapted to pin the liquid deposited on a first side of an overhanging section and the second elevated region adapted to pin liquid deposited on a second side—opposite to said first side—of the overhanging section. Since the elevated regions are separated by a recessed region no merging of fluid occurs or at least a much larger quantity can be deposited before merging occurs.

Examples of an overhanging relief pattern having a relief structured top surface include an overhanging section having a top surface provided with ridge-shaped protrusions along the boundary of the top surface. The ridges may be a separate structure or an integral part of the overhanging section.

These and other aspects of the invention will be apparent from and elucidated with reference to the embodiments described hereinafter.

Figure 2:
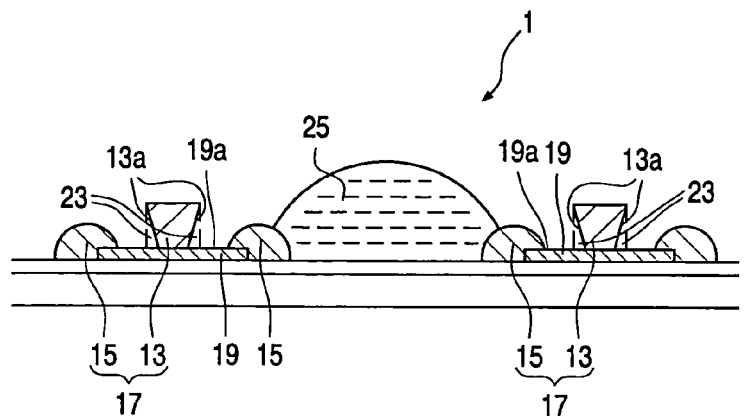
Figure 3:
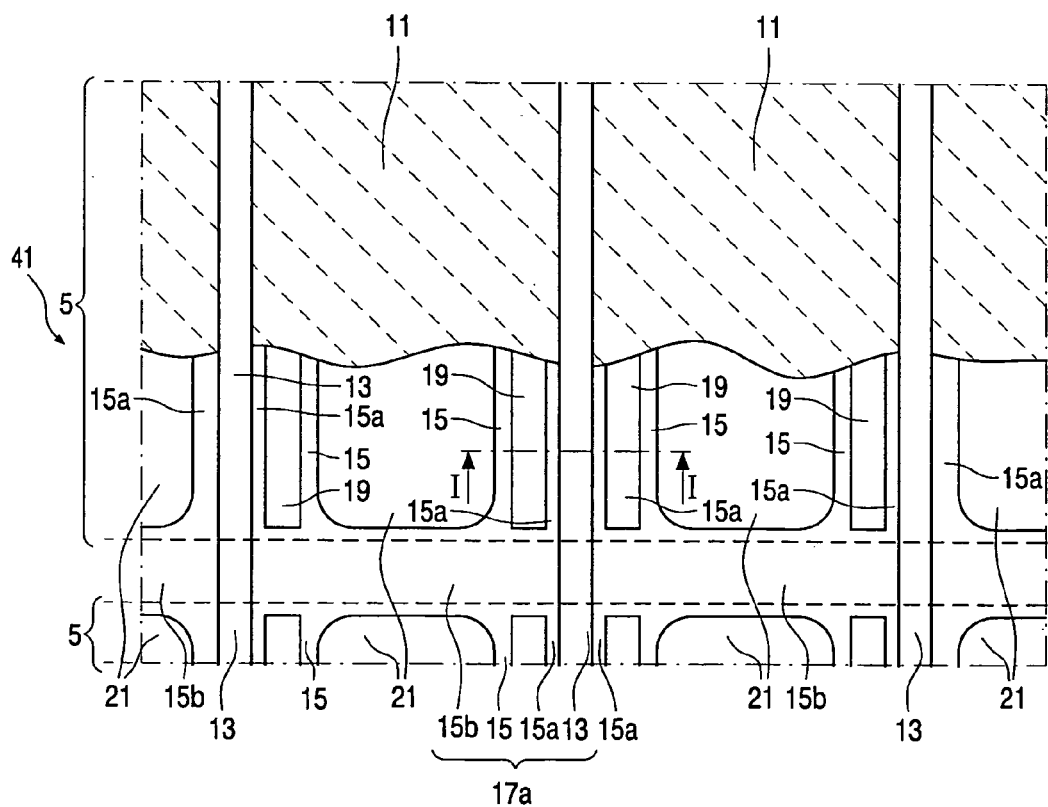
Figure 4:
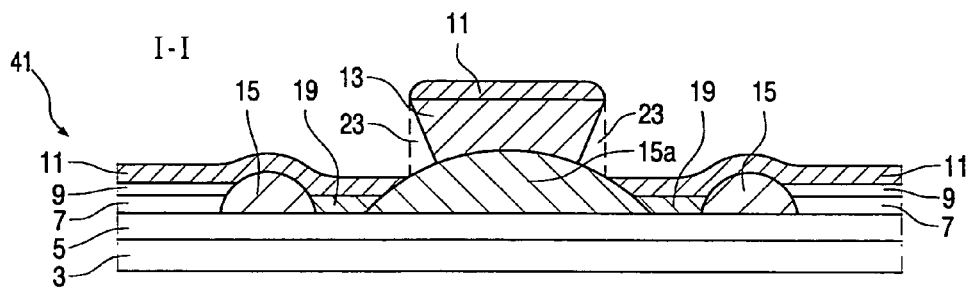
Figure 5:
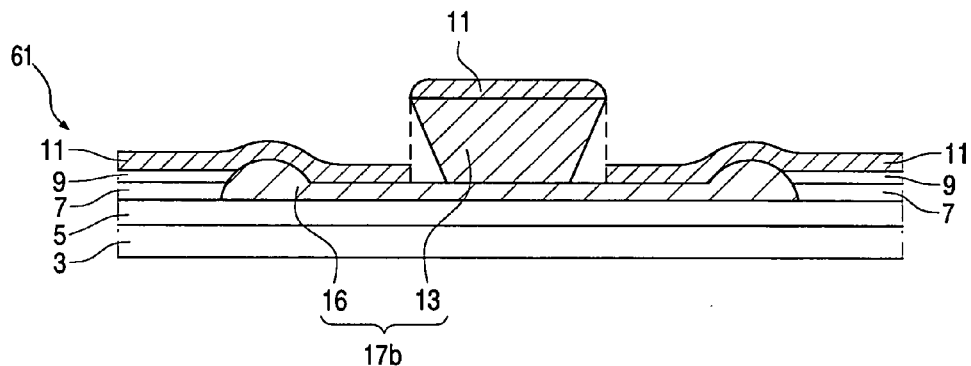
Figure 7:
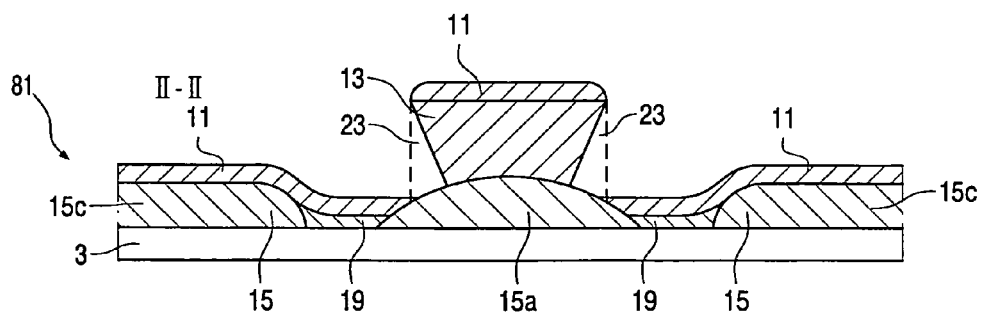
Figure 6:
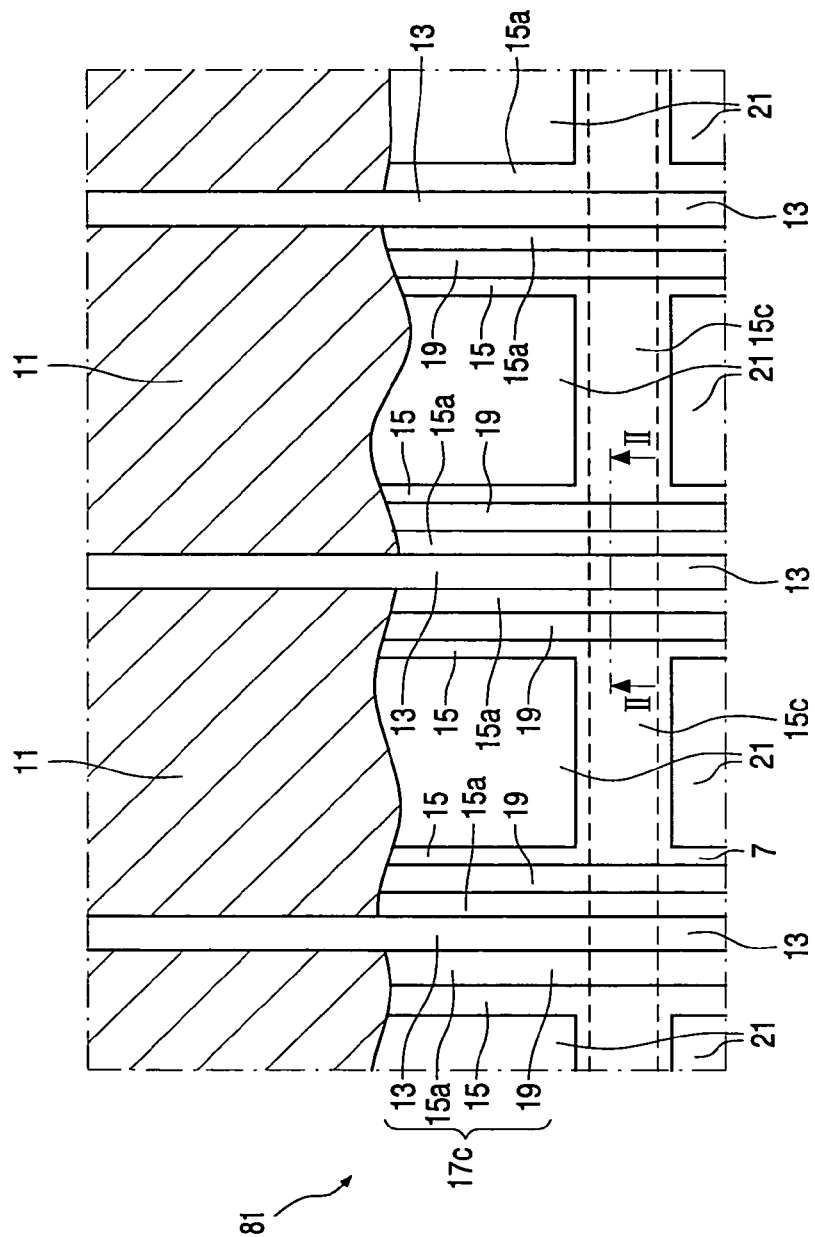
Figure 8:
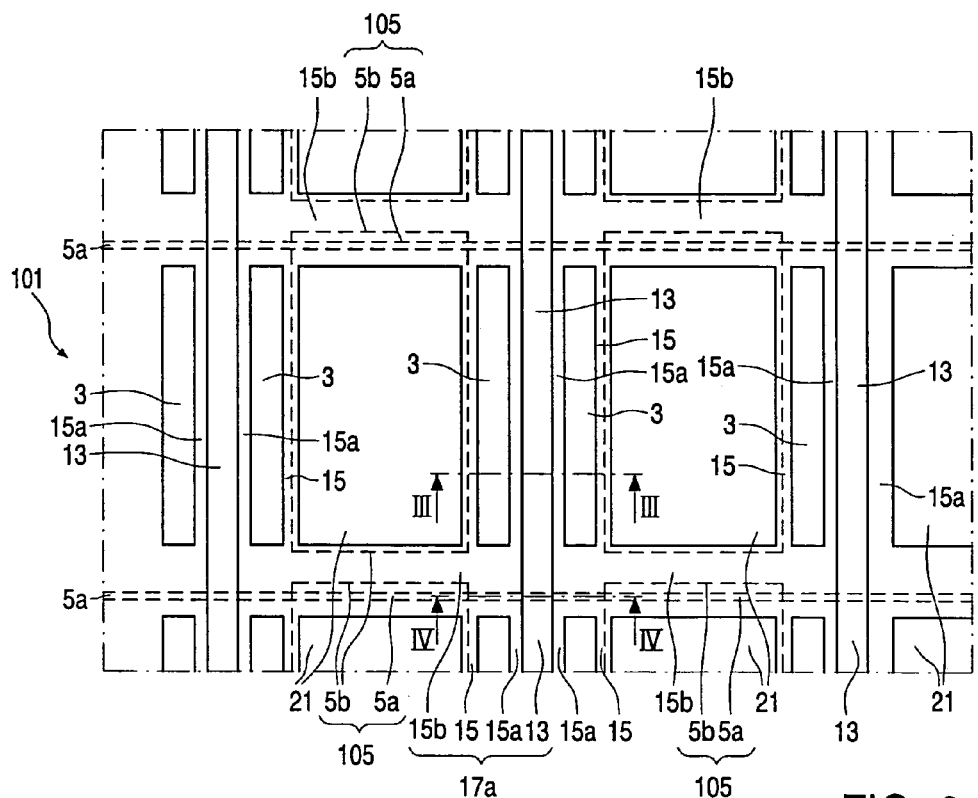
Figure 9:
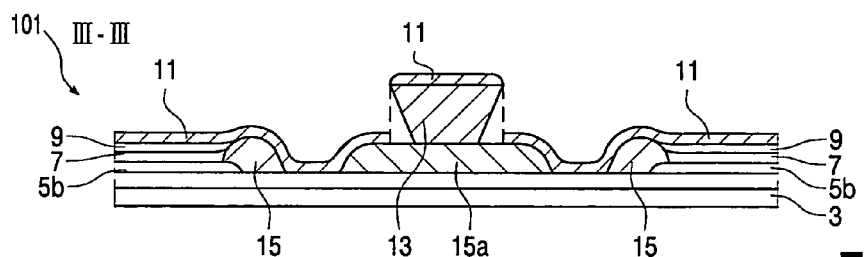
Figure 10:
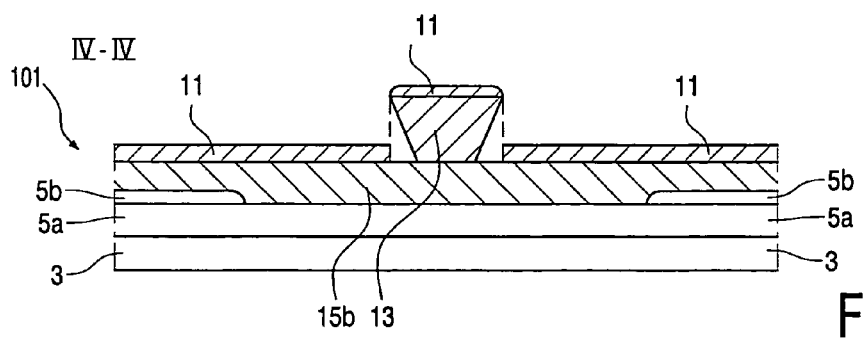
Figure 11:
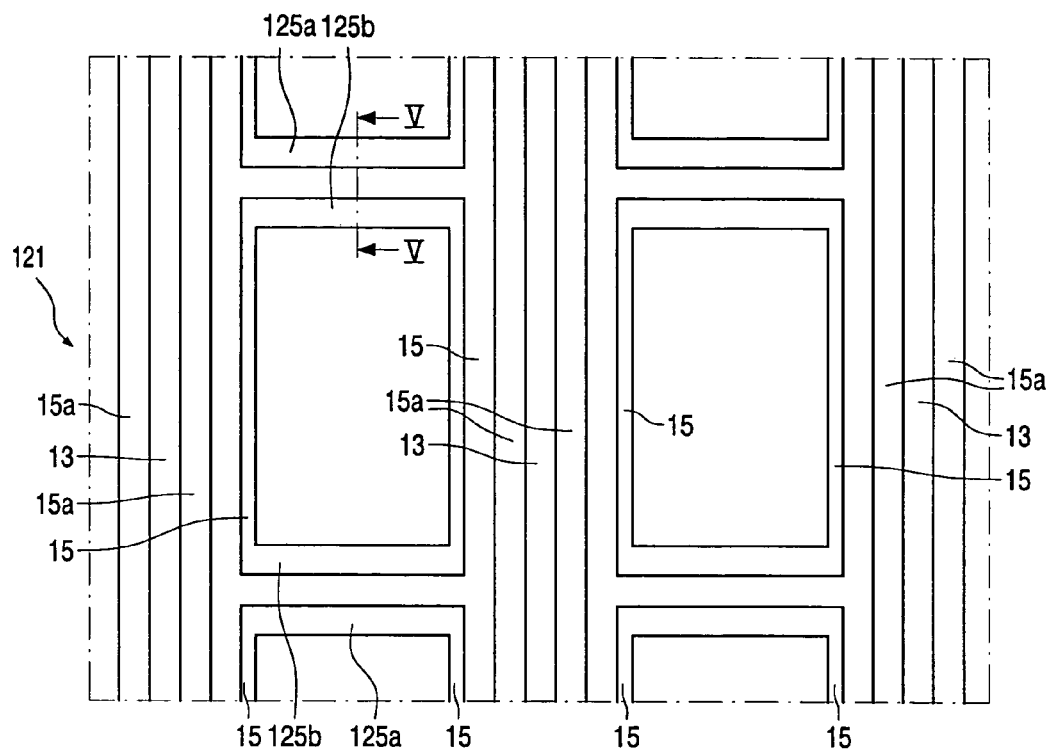
Figure 12:
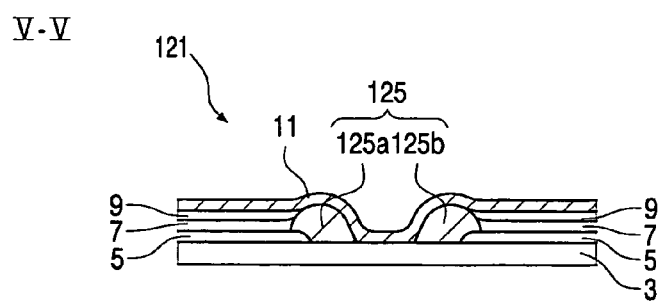

In the drawings:

FIG. 1 shows, schematically, in a perspective plan view, a first embodiment of an EL device in accordance with the invention, FIG. 2 shows, schematically, in a cross-sectional view, a stage of manufacture of the EL device shown in FIG. 1, FIG. 3 shows, schematically, a plan view of a second embodiment of an EL device in accordance with the invention, FIG. 4 shows, schematically, a cross-sectional view along the line I—I in FIG. 3, FIG. 5 shows, schematically, a cross-sectional view of a third embodiment of an EL device in accordance with the invention, FIG. 6 shows, schematically, a plan view of a fourth embodiment of an EL device in accordance with the invention, FIG. 7 shows, schematically, a cross-sectional view along the line II—II in FIG. 6, FIG. 8 shows, schematically, a plan view of a fifth embodiment of an EL device in accordance with the invention, FIG. 9 shows, schematically, a cross-sectional view along the line III—III in FIG. 8, FIG. 10 shows, schematically, a cross-sectional view along the line IV—IV in FIG. 8, FIG. 11 shows, schematically, a plan view of a sixth embodiment of an EL device in accordance with the invention, and FIG. 12 shows, schematically, a cross-sectional view along the line V—V in FIG. 11.

FIG. 1 shows, schematically, in a perspective plan view, a first embodiment of an EL device in accordance with the invention and FIG. 2 shows, schematically, in a cross-sectional view, a stage of manufacture of the EL device shown in FIG. 1.

Referring to FIGS. 1 and 2, the first embodiment, EL device 1, a matrix display device of the passive type, comprises a substrate 3, a first electrode layer 5 of row electrodes, and a second electrode layer 11 comprising column electrodes. Functional layers are disposed between the electrode layers 5 and 11, a first functional layer in the form of a patterned charge transport/injection layer 7 and a second functional layer in the form of a patterned electroluminescent layer comprising sections 9R and 9G.

Independently addressable electroluminescent areas 21 are formed at crossings of row electrodes 5 and column electrodes 11, the area being defined by the area of overlap of the electrode layers 5 and 11, the charge transport layer 7 and the electroluminescent layer sections 9R or 9G.

A relief pattern 17 comprises overhanging sections 13 in the form of strips extending along and between the column electrodes of the electrode layer 11 and accompanying positively-sloped rib sections 15 extending along and set up at distance of the overhanging sections 13. The overhanging sections 13 have a function of patterning the second electrode layer 11 such that its constituent column electrodes are mutually electrically insulated. Referring to FIG. 2, the edges 13a of the overhanging sections 13 cooperate with the surfaces 19a supporting the overhanging sections 13 to form V-shaped channels 23. Due to the V-shape of the channels 23, the channels 23 act as capillaries which are capable of effectively taking up and transporting fluid.

In order to prevent or at least hinder the take-up and/or transport of fluid along the capillary channels 23 and/or the redeposition of fluid so taken up and/or transported into unwanted areas, such as the electroluminescent areas 21 adjacent the area in which fluid is to be deposited, the relief pattern 17 comprises accompanying sections 15 which are erected at distance of the overhanging sections 13. The accompanying sections 13 extend along the overhanging sections 13 and sides of the EL areas 21.

Referring to FIG. 2, the accompanying sections 15 are capable of stopping the fluid 25 deposited in the well outlined by accompanying sections 15 located on opposite sides of an EL area 21. In the present example, the fluid 25 is convertible into the functional layer 7 of the EL device 1. By stopping the fluid 25 and/or any other fluids from which functional layers such as the EL layers 9R and 9G are obtainable, the accompanying sections 15 serve to or at least assist in patterning the EL areas 21. The accompanying sections 15 are positively-sloped in order to prevent the formation of an effective capillary channels along its edges.

In order to prevent short-circuits between the first electrode layer 5 and the second electrode layer 11 electrically insulating layers 19 are provided.

An exemplary embodiment of the EL device 1 comprises a substrate 3 of a material transparent to the light to be emitted, such as glass, and a likewise transparent first electrode layer 5, such as an ITO electrode layer. If ITO is used for the first electrode layer 5 and the EL device 1 is of the light-emitting diode type, the layer 5 is the anode layer as it serves to inject holes and the layer 7 may be a hole transport/injection layer such as PEDOT. The second electrode layer 11, the cathode layer, is a low-work function layer, such as a Ba/Al double layer. The relief pattern 17 and the insulating layer 19 may be made of photoresist.

By way of example, the exemplary embodiment of a full-color EL device 1 having RGB-pixels of 300 by 300 $\mu$m divided into R, G and B-pixels measuring 100 by 300 a$\mu$m can be manufactured as follows:

First the transparent-lime glass substrate 3 is, in a conventional manner, provided with a patterned first electrode 5 layer of ITO. Specifically, a substrate 3 of 1.1 mm thick soda-lime glass coated with a 15 $\Omega$/square 150 nm thick ITO layer (supplier Balzers) is provided and the ITO layer patterned in a 290 $\mu$m wide lines and 10 $\mu$m wide spaces pattern in a conventional manner to obtain the first electrode layer 5 comprising first electrodes in the form of row electrodes which serve as anodes.

In a first photolithographic step the electrically insulating layers 19 are provided by spinning a photoresist on the substrate, exposing the spun-on resist using a mask and developing the exposed resist in a standard developer, resulting in insulating strips 19 which are 60 $\mu$m wide and 0.5 $\mu$m thick. In order to render the layers 19 resistant to further photolithographic steps the photoresist layer 19 is hard-baked.

Then the relief pattern 17 is provided in two separate photolithographic steps. In the first step, positively-sloped sections 15 are provided using conventional photoresist which are then hard-baked to render the sections 15 resistant to the process of providing the sections 13. The sections 15 are formed in strips of 10 $\mu$m width and 3 $\mu$m thickness. Furthermore, if the sections 15 need to have a rounded transverse profile, the sections 15 are subjected to a hard-bake at a temperature and duration sufficient to enable the resist to flow which will produce a liquid drop shape profile. The relief pattern section 15 are rounded to reduce the risk that second electrodes are become unintentionally electrically insulated when crossing a section 15.

In the second photolithographic step of providing the relief pattern 17, the overhanging relief sections 13 are formed. There are many conventional methods known to manufacture such overhanging sections. One way is to spin-coat (1000 rpm) a layer of the image reversal photoresist AZ5218-e (supplier AZ Hoechst). The photoresist is exposed pattern-wise using a mask in proximity (40 $\mu$m gap) with a dose of 32 mJ/cm$^2$, hard-baked at 110° C. for 10 min, flood exposed with a dose of 400 mJ/cm$^2$, developed using a 1:1 AZ-developer:deionized-water developer for a time sufficient to obtain a negative slope of 45°, and post-baked at 100° C. for 15 min. This results in overhanging sections 13 having an inverted trapezoidal shape and a thickness of about 3 $\mu$m.

A charge transport layer 7 is ink-jet printed by depositing a 3% by weight aqueous solution of poly-3,4-ethylenedioxythiophene, PEDOT, (Baytron P, supplier Bayer AG), in straight lines and in a direction at right angles to the sections 13 and 17 of the relief pattern 17. The wettability of the electrode layer 5 with respect to the fluid from which the PEDOT layer is obtained is selected such that neighboring lines of fluid so ink-jetted do not merge. Alternatively, if the wettability is such that neighboring lines do merge, the resistivity of the PEDOT used is selected to be as high as possible to reduce leakage currents between neighboring anodes 5.

Ink-jet printing may be performed in essentially two different ways. In this respect it is of interest to note that, generally, the (maximum) thickness of the fluid 25 is much larger than the height of the relief pattern 17.

In a first embodiment of ink-jet printing, the dispensing of ink drops is interrupted when crossing the sections of the relief pattern 17 and drops are deposited only in the well defined by accompanying sections 15 bordering a same electroluminescent area 21. This has the advantage that no fluid is deposited in the region between the overhanging sections 13 and the accompanying sections 15 and the effect of the capillary channel 23 is effectively suppressed. The down side is that alignment of ink jet head has to be accurate in two independent directions, viz. the direction in which the jet is moving and the direction perpendicular thereto. In the direction of travel an equal, integral number of drops has to be deposited in each and every well.

In a second embodiment of ink-jet printing, the dispensing of ink drops is not interrupted when crossing sections of the relief pattern 17. The drops are printed sufficiently close so that the drops merge to form a continuous line of fluid which crosses, at least immediately after merging, the sections 13 and 15 uninterrupted. Thus, alignment accuracy is only required in the directions at right angles to the direction in which the inkjet head travels. However, not stopping when crossing a relief pattern results in fluid possibly being deposited in the area between the overhanging and accompanying sections 13 and 15 respectively.

In any case, at some point in time after the fluid containing PEDOT is deposited, the deposited fluid 25 is stopped by the accompanying sections 15. While remaining pinned on the sections 15, the fluid is converted to the PEDOT layer and a homogeneous, uniform in thickness PEDOT layer is obtained.

The electroluminescent layer comprises separate sections 9R, 9G. The section 9R is manufactured according to one of the embodiments of the ink-jet method described above for PEDOT. Specifically, a nozzle releasing, at constant frequency, a jet of 150 pl drops of fluid containing solvent and electroluminescent layer material, a red-emissive fluorene-based polymer supplied by Cambridge Display Technology Ltd. is moved at constant velocity in a direction at right angles to the strips forming the overhanging sections 13. The wettability of the fluid with respect of the substrate onto which it is deposited is selected such that the fluid does not spread into areas where the layer 9G is to be deposited. Such spreading may be suppressed by providing anti-wetting strips deposited by means of micro-contact printing.

The accompanying sections 15 prevent fluid which is meant to be deposited into the area 9 R from reaching the capillary channels 23 or, if some of this fluid has reached it, (for example because the ink-jetting is not interrupted when crossing the relief pattern 17) prevent it from being released into a neighboring light emitting area 21 such as the areas corresponding to the layer 9G. The fluid layer pinned by the sections 15 is maximally about 10 $\mu$m thick and produces, after conversion, a 70 nm layer 9R.

Similarly, a green (and a blue, not shown) emitting electroluminescent layer 9G is ink-jetted.

Typically, the ink-jet solutions containing EL material contain 0.2–1.5% by weight polymer in xylene and have a viscosity of about 5 mPa.

While using the overhanging sections 13 as a built-in shadow mask, 3 nm thick Ba and 200 nm thick Al layers are successively deposited on top of the EL layers 9R, 9G. The patterned Ba/Al layers thus obtained constitute the second electrode layer 11 comprising a plurality of column electrodes (cathodes).

In a slightly modified embodiment the array of sections 9R (and 9G) are not positioned in an array extending at right angles to the overhanging section but extending parallel thereto. This renders the inkjet printing process much more simple as the ink-jet head does not cross the overhanging sections while dispensing fluid.

Referring to FIGS. 3 and 4, the second embodiment, the passive matrix EL device 41, has a substrate 3 on which a first electrode layer 5 in the form of row electrodes is provided. The device 41 comprises a second electrode layer 11 in the form of column electrodes. A charge transport/injecting layer 7 and an EL layer 9 are disposed between the electrode layers 5 and 11. At crossings of the electrode layers 5 and 11, more particular in regions of overlap of the electrode layers 5 and 11 and the layer 7 and 9R and 9G respectively, EL areas 21 are formed in the form of independently addressable EL elements.

The EL device 41 further comprises a relief pattern 17a. The relief pattern 17a has overhanging sections 13 for the patterning second electrode layer 11 into separate columns. Erected at a distance of the sections 13 and along a side of the EL areas 21 accompanying sections 15 are positioned which have the function of preventing fluid which is used in the deposition of the functional layers 7 and/or 9 from reaching the capillary channels 23 formed by overhanging sections 13. The overhanging sections 13 are supported by pedestal sections 15a. Generally, the positioning of the overhanging sections 13 on pedestals does not prevent the taking-up and/or transport of fluid by the capillary channels, so the use of the accompanying sections 15 is essential. In order to prevent to short-circuits between the electrode layers 3 and 11, electrically insulating layers 19 are provided, which may, but this is not essential, be considered as further sections of the relief pattern 17a.

Partitioning positively-sloped relief pattern sections 15b are positioned along the sides of the EL areas 21 other than the sides along which the accompanying sections 15 extend. The partitioning sections 15b and the accompanying sections 15 together form wells for containing fluid from which functional layers, such as the layers 7 and 9, are obtainable. The partitioning sections 15b serve to stop and pin fluid deposited in the well and prevent or at least hinder the spreading of the fluid in the longitudinal direction of the overhanging sections 13.

In the corners of EL areas 21, partitioning sections 15b and accompanying sections 15 meet. In order reduce the tendency of fluid to creep up the relief pattern at these meeting points, the corners defined by these meeting points are rounded.

Conveniently, any fluid from which a functional layer 7 or 9 is obtainable is deposited by means of ink-jet printing. Obviously, if an ink-jet head freely positionable in a plane parallel to the substrate is used, functional layers can be deposited in any pattern and any separate areas of said pattern can be printed in any sequence. However, alignment is simpler and more robust and throughput time is increased if ink-jet printing is performed by moving the ink-jet head relative to the substrate in straight lines in a direction parallel to the overhanging sections 13. Alternatively, printing in a line may be at right angles to said sections 13. When printing in a line, the dispensing of ink drops may be interrupted or uninterrupted when the inkjet head crosses a section of the relief pattern.

If printing is interrupted, ink will be dropped only in the wells outlining the EL areas 21 which is advantageous for printing intricate patterns not accessible by continuous line printing. Such intricate patterns, such as example checker board or honeycomb patterns, are of particular use in multicolor displays when printing EL areas emitting different colors need to be printed to from for examples RGB pixels.

If printing is uninterrupted, the ink drops are positioned on the substrate sufficiently close together for the ink drops to merge to form a continuous line of fluid uninterrupted, at least just after having been deposited, by the sections of the relief pattern 17a. This has the advantage that alignment is only necessary in the direction at right angles to the direction in which the inkjet head moves. If printing is at right angles to the sections 15, the spaces between the accompanying section 15 and the overhanging sections 13 will be provided with fluid as well and, when converted with functional material which may or may not be desirable. In this case, the accompanying sections 15 serve in particular to stop fluid deposited in these spaces and transported to neighboring areas 21 by the capillary channels 23 from entering said neighboring EL areas 21.

Those skilled in the art will appreciate that the above-described ways in which ink-jet printing can be performed may constitute inventions in their own right, independent of the use accompanying sections of the present invention.

The relief pattern 17a may be formed by first depositing the accompanying sections 15, the partitioning sections 15b and the pedestal sections 15a, then depositing the insulating areas 19 and finally the overhanging sections 13.

FIG. 5 shows, schematically, a cross-sectional view of a third embodiment of an EL device in accordance with the invention. The third embodiment, the EL device 61, differs from the EL device 41 only in the manner in which the relief pattern is formed. In EL device 61, the accompanying sections, the partitioning sections, the pedestal sections, and the insulating areas are integrated to form an integral section 16. The integral section may be deposited in a single (photolithographic) deposition step. If deposited photolithographically, two superposed semi-transparent masks each having a mutually different pattern or an appropriate gray level mask can be suitably used. Subsequently, the overhanging section 13 is provided thus completing the relief pattern 17b.

Referring to FIGS. 6 and 7, the fourth embodiment, EL device 81, is only slightly modified compared to EL device 41, in that the partitioning sections 15c do not extend beyond but end at the accompanying sections 15. By having a relief pattern 17c which does not comprise a section bridging the pedestal sections 15a on the one hand and the accompanying sections 15 and partitioning sections 15b on the other hand, it is, compared to EL device 41, even more difficult for fluid to reach capillary channels 23 of the overhanging sections 13.

Referring to FIGS. 8, 9 and 10, the fifth embodiment, EL device 101, is similar to EL device 41 but the first electrode layer is different. Referring to FIG. 8, (second electrode layer not shown), the first electrode layer 105 has bus electrodes 5a and pixel electrodes 5b. Referring to FIG. 10, the bus electrodes 5a are buried by partitioning sections 15b of the relief pattern 17a thus electrically insulating the first electrode layer 105 from the second electrode layer 11. Referring to FIG. 9, use of the bus electrodes 5a obviates the need to provide electrically insulating layers in the region between the negatively-sloped sections 13 and the accompanying positively-sloped sections 15.

Instead of being positioned alongside the EL areas 21, the bus electrodes 5a, also referred to as (metal) shunts, may also be positioned in between EL areas 21 to connect EL areas 21 in a same row, for example at the line III—III in FIG. 8. Obviously, in order to prevent short-circuiting between the bus electrode and the second electrode layer 11, such bus electrode is covered with relief pattern material. Preferably, the bus electrodes only connect but do not cross the active EL areas 21. Arranging the bus electrodes in between the EL areas 21 increases the surface area of the EL areas 21 because the need to bury the bus electrodes in the arrangement of FIG. 8 is obviated and thus the relief pattern section used for this purpose can then be made narrower. The larger EL areas 21 so obtained also lessen the requirements with respect to drop placement accuracy in the ink jet printing process.

Referring to FIG. 11, in which only the layout of the relief pattern is shown, and 12, the sixth embodiment, EL device 121 has partitioning sections 125 which are subdivided into mutually separate subsections 125a and 125b. The subsections 125a and 125b form together with the accompanying sections 15 a well into which fluid from which a functional layer such as 7 and 9 are obtainable can be deposited.

What is claimed is:

1. A method of manufacturing an electroluminescent device, comprising:
  forming a pattern including an overhanging structure with a negatively-sloped section thereunder and a functional region bounded on at least one side by a positively-sloped section, the overhanging structure being on a side of the positively-sloped section that is opposite the functional region;
  depositing a liquid suitable for forming a functional layer within the functional region such that the liquid contacts the a positively-sloped surface of the positively-sloped sections, the positively-sloped sections having a shape and size such that at least some of the liquid is prevented from reaching the negatively-sloped section and being taken up by a capillary channel of the negatively-sloped section; and
  processing the liquid to form an electroluminescent region.

2. The method of claim 1, wherein the step of forming includes forming a photoresist section and hard-baking it to define the positively-sloped section.

3. The method of claim 1, wherein the step of depositing includes inkjet printing the liquid on the relief pattern.

4. The method of claim 1, wherein the step of forming includes forming at least two positively-sloped sections bounding the functional region on opposite sides.

5. The method of claim 4, wherein the step of forming includes forming a photoresist section and hard-baking it to define the positively-sloped section.

6. The method of claim 4, wherein the step of depositing includes inkjet printing the liquid on the relief pattern.

7. The method of claim 1, wherein the step of forming includes forming at least two positively-sloped sections surrounding the functional region to form a well-shaped region coinciding with the functional region.

8. The method of claim 4, wherein the step of forming includes forming a photoresist section and hard-baking it to define the positively-sloped section.

9. The method of claim 4, wherein the step of depositing includes inject printing the liquid on the relief pattern.

10. A method for manufacturing an electroluminescent device, comprising:
  creating a pattern on a substrate including a well-shaped region defined by at least one rounded rib section and an overhanging region, the overhanging region defining a negatively-sloped channel which lies outside the well-shaped region, a positively-sloped surface of the rib section facing away from the substrate and partly facing at least the well-shaped region;
  depositing a liquid effective to form an active region in the well, the liquid contacting the positively-sloped surface, the rib thereby preventing an up take of the liquid by a capillary channel of the overhanging region;
  forming a functional layer from the liquid in the well-shaped region.

11. The method of claim 10, including the step of forming an electrode layer prior to forming the step of creating a well region such that an electrode layer lies at a bottom of the well region.

12. The method of claim 10, wherein the step of depositing includes inkjet printing.

13. A method for manufacturing an electroluminescent device, comprising:
  preventing a take up of liquid by a capillary channel formed by a negatively-sloped section of at least one structure on a substrate adjacent a region where the liquid is to be deposited the capillary channel by forming a rib located between the region and a capillary channel whose shape and size is effective to prevent the liquid from being taken up by the capillary channel such that a substantial quantity remains in the region;
  depositing a liquid on a region of a substrate, the liquid being effective to form an electroluminescent functional layer;
  forming a functional layer from the liquid remaining in the region.

14. The method of claim 13, including the step of forming an electrode layer prior to forming the step of forming a rib such that an electrode layer lies at a bottom of the region.

15. The method of claim 13, wherein the step of depositing includes inkjet printing.

* * * * *